United States Patent
Schardt et al.

(10) Patent No.: US 8,455,904 B2
(45) Date of Patent: Jun. 4, 2013

(54) NON-RADIATIVELY PUMPED WAVELENGTH CONVERTER

(75) Inventors: Craig R. Schardt, Woodbury, MN (US); Catherine A. Leatherdale, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/264,833

(22) PCT Filed: Apr. 19, 2010

(86) PCT No.: PCT/US2010/031577
§ 371 (c)(1),
(2), (4) Date: Oct. 17, 2011

(87) PCT Pub. No.: WO2010/123809
PCT Pub. Date: Oct. 28, 2010

(65) Prior Publication Data
US 2012/0037885 A1    Feb. 16, 2012

Related U.S. Application Data

(60) Provisional application No. 61/170,766, filed on Apr. 20, 2009.

(51) Int. Cl.
*H01L 33/00*    (2010.01)

(52) U.S. Cl.
USPC ................................. 257/98; 257/E33.008

(58) Field of Classification Search
CPC ............ H01L 33/20; H01L 33/60; H01L 33/62
USPC ...................... 257/13, 98, E33.008
See application file for complete search history.

(56) References Cited

U.S. PATENT DOCUMENTS

2003/0160259 A1    8/2003    Uemura
2003/0219625 A1    11/2003    Wolk
(Continued)

FOREIGN PATENT DOCUMENTS

EP    1 762 642    3/2007
EP    1 990 842    11/2008
(Continued)

OTHER PUBLICATIONS

Xu et al., "Application of blue-green and ultraviolet micro-LED to biological imaging and detection", 2008, Journal of Physics D: Applied Physics, 41,094013, pp. 1-13, May 2008.*

(Continued)

*Primary Examiner* — Nikolay Yushin
(74) *Attorney, Agent, or Firm* — Kristofor L. Storvick

(57) ABSTRACT

A light source has an active layer (204) disposed between a first doped semiconductor layer (206) and a second doped semiconductor layer (208). The active layer has energy levels associated with light of a first wavelength. Light emitting elements (216) are positioned on the surface of the first doped semiconductor layer (206) for non-radiative excitation by the active layer. The light emitting elements are capable of emitting light at a second wavelength different from the first wavelength. In some embodiments a grid electrode (213) is disposed on the first doped semiconductor layer and defines open regions (214) of a surface of the first doped layer, the first plurality of light emitting elements being positioned in the open regions. In some embodiments a second plurality of light emitting elements is disposed over the first plurality of light emitting elements for non-radiative excitation by at least some of the first plurality of light emitting elements.

15 Claims, 5 Drawing Sheets

U.S. PATENT DOCUMENTS

| | | | |
|---|---|---|---|
| 2004/0061124 | A1 | 4/2004 | Trottier |
| 2005/0253152 | A1 | 11/2005 | Klimov |
| 2006/0071225 | A1 | 4/2006 | Beeson |
| 2006/0091789 | A1* | 5/2006 | Aoyama et al. ............... 313/502 |
| 2006/0124917 | A1 | 6/2006 | Miller |
| 2006/0145137 | A1 | 7/2006 | Wang |
| 2007/0085100 | A1 | 4/2007 | Diana |
| 2008/0121818 | A1 | 5/2008 | Agrawal |
| 2008/0217639 | A1 | 9/2008 | Kim |
| 2009/0194774 | A1* | 8/2009 | Huang et al. .................... 257/88 |
| 2010/0224857 | A1 | 9/2010 | Soh |
| 2011/0156616 | A1 | 6/2011 | Anderson |

FOREIGN PATENT DOCUMENTS

| | | |
|---|---|---|
| JP | 56-110475 | 8/1981 |
| JP | 2001-237461 | 8/2001 |
| WO | WO 2007/095173 | 8/2007 |
| WO | WO 2007/146861 | 12/2007 |
| WO | WO 2009/039815 | 4/2009 |
| WO | WO 2009/047425 | 4/2009 |
| WO | WO 2010/028146 | 3/2010 |
| WO | WO 2010/123814 | 10/2010 |

OTHER PUBLICATIONS

Tsukazaki et al., "Blue Light-Emitting Diodes Based on ZnO", 2005, Japanese Journal of Applied Physics, vol. 44, No. 21 pp. L643-L645, May 2005.*

Janotti et al, Fundamentals of zinc oxide as a semiconductor: 2009 Rep. Prog. Phys., vol. 72, 126501, pp. 1-29, Jul. 2009.*

Elfstrom et al., "Quantum dot nano-composites as colour-converters for micro-pixellated gallium nitride light-emitting diodes", 2008, IEEE Lasers and Electro-Optics Society, 2008. LEOS 2008. 21st Annual Meeting of the, pp. 505-506 , Nov. 2008.*

Achermann et al., "'Noncontact' pumping of semiconductor nanocrystals via nonradiative energy transfer from a proximal quantum well", 2 pages, © 2000 Optical Society of America.

Achermann et al., "Picosecond Energy Transfer in Quantum Dot Langmuir-Blodgett Nanoassemblies", Journal of Physical Chemistry B, pp. 13782-13787, © 2003 American Chemical Society, Published on Web Nov. 20, 2003.

Achermann et al., "Nanocrystal-Based Light-Emitting Diodes Utilizing High-Efficiency Nonradiative Energy Transfer for Color Conversion." Nanoletters 2006, vol. 6, No. 7, pp. 1396-1400, © 2006American Chemical Society.

Belton et al., "New light from hybrid inorganic-organic emitters," Journal of Physics D: Applied Physics, 41, 0940006, 12 pages, © 2008 IOP Publishing.

Crooker et al., "Spectrally Resolved Dynamics of Energy Transfer in Quantum-Dot Assemblies: Towards Engineered Energy Flows in Artificial Materials", Physical Review Letters, pp. 186802-1-186802-4, vol. 89, No. 18, Oct. 28, 2002.

Gong et al., "Efficient flip-chip InGaN micro-pixellated light-emitting diode arrays: promising candidates for micro-displays and colour conversion", Journal of Physics D: Applied Physics, vol. 41, 6 pages, © 2008 IOP Publishing Ltd.

Kang, Myung-Gyu and Guo, Jay L., "Nanoimprinted Semitransparent Metal Electrodes and Their Application in Organic Light-Emitting Diodes," Advanced Materials 2007, vol. 19, pp. 1391-1396, © 2007 Wiley-VCH Verlag GmbH & Co. KGaA, Weinheim.

Lambert et al., "Quantum Dot Micropatterning on Si", Langmuir 2008, pp. 5961-5966, © 2008 American Chemical Society, Published on Web Apr. 29, 2008.

Miyake et al. "Fabrication and Evaluation of Three-Dimensional Optically Coupled Common Memory", Japanese Journal of Applied Physics, vol. 34, No. 2B, pp. 1246-1248, Feb. 1995.

Search Report for International Application No. PCT/US2010/031577, 7 pages, Date of Mailing Dec. 1, 2010.

Written Opinion for International Application No. PCT/US2010/031577, 10 pages, Date of Mailing Dec. 1, 2010.

* cited by examiner

NON-RADIATIVELY PUMPED WAVELENGTH CONVERTER

CROSS REFERENCE TO RELATED APPLICATIONS

This application is a national stage filing under 35 U.S.C. 371 of PCT/US2010/0031577, filed on Apr. 19, 2010, which claims priority to U.S. Provisional Application No. 61/170,766, filed on Apr. 20, 2009, the disclosure of which is incorporated by reference in its/their entirety herein.

FIELD OF THE INVENTION

The invention relates to light sources, and more particularly to non-contact pumping or light emitting nanoparticles via non-radiative energy transfer. The invention is particularly suitable for producing light at various different wavelengths over different parts of a light emitting diode structure.

BACKGROUND

Illumination systems are used in many different applications, including projection display systems, backlights for liquid crystal displays and the like. Projection systems often use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green emitting LEDs, are relatively inefficient.

Conventional light sources are generally bulky, inefficient in emitting one or more primary colors, difficult to integrate, and tend to result in increased size and power consumption in optical systems that employ them.

Wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together. One example of such an application is in the back-illumination of displays, such as liquid crystal display (LCD) computer monitors and televisions. In such applications there is a need for substantially white light to illuminate the LCD panel. One approach to generating white light with a single LED is to first generate blue light with the LED and then to convert some or all of the light to a different color. For example, where a blue-emitting LED is used as a source of white light, a portion of the blue light may be converted using a wavelength converter to yellow light. The resulting light, a combination of yellow and blue, appears white to the viewer. The color (white point) of the resulting light, however, may not be optimum for use in display devices, since the white light is the result of mixing only two different colors.

LEDs are also being used in image display systems, for example in television screens. In such applications an arrangement of individually addressable LEDs emitting red, green and blue light is used to illuminate one pixel. The relative luminance of each LED can be controlled so as to control the overall color perceived from the pixel.

In the newly-developing field of microprojection, a single LED imager device has been disclosed that includes individually addressable areas, pixels, that produce different colors, for example red, green and blue. The image is formed on the device by selectively illuminating the various pixels and projecting the image of the imager device.

Another approach to producing a color of light from an LED structure is the use of non-radiative coupling to transfer the energy from carriers in the active region of the LED to light emitting elements such as nanocrystals positioned on the surface of the LED. The nanocrystals subsequently emit light at a wavelength different from the wavelength of light had a photon been generated in the active region of the LED. In this technique, the LED does not emit pump light that is later converted to light at a different wavelength. Instead, the non-radiative dipole-dipole interaction between the nanocrystal and carriers in the active region transfers energy directly to the nanocrystal without a pump photon ever being formed. The strength of the dipole-dipole interaction, however, is strongly inversely dependent on the distance separating the nanocrystals from the active region, and so the upper doped layer of the LED, separating the active region from the nanocrystals, is necessarily very thin, around 10 nm or so.

Such a thin upper doped layer reduces the ability to spread current laterally from an electrode, and so the size and brightness uniformity of such devices is compromised. There remains a need to improve the performance of LED arrays that use light emitting, non-radiatively coupled nanocrystals for producing a uniform, large area emitter with differently colored pixels.

SUMMARY OF THE INVENTION

One embodiment of the invention is directed to a light source that includes a light emitting diode (LED) structure having an active layer disposed between a first doped semiconductor layer and a second doped semiconductor layer. The active region has energy levels associated with light of a first wavelength. A grid electrode is disposed on the first doped semiconductor layer. The grid electrode defines open regions of a surface of the first doped layer. The light source also includes a first plurality of light emitting elements positioned on the surface of the first doped semiconductor layer in the open regions of the grid electrode. At least some of the light emitting elements are excited by non-radiative energy transfer from the active layer. The light emitting elements are capable of emitting light at a second wavelength different from the first wavelength.

Another embodiment of the invention is directed to a light source that includes a light emitting diode (LED) structure having comprising an active layer disposed between a first doped semiconductor layer and a second doped semiconductor layer. The active region has energy levels associated with light of a first wavelength. A first plurality of light emitting elements is positioned on at least part of a surface of the first doped semiconductor layer. At least some of the light emitting elements are excited by non-radiative energy transfer from the active layer. The light emitting elements are capable of emitting light at a second wavelength different from the first wavelength. A second plurality of light emitting elements is disposed over at least some of the first plurality of light emitting elements. At least some of the second plurality of light emitting elements are excited by non-radiative energy transfer from at least some of the first plurality of light emitting elements. The second plurality of light emitting elements are capable of emitting light at a third wavelength different from the second wavelength.

The above summary of the present invention is not intended to describe each illustrated embodiment or every implementation of the present invention. The following figures and detailed description more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
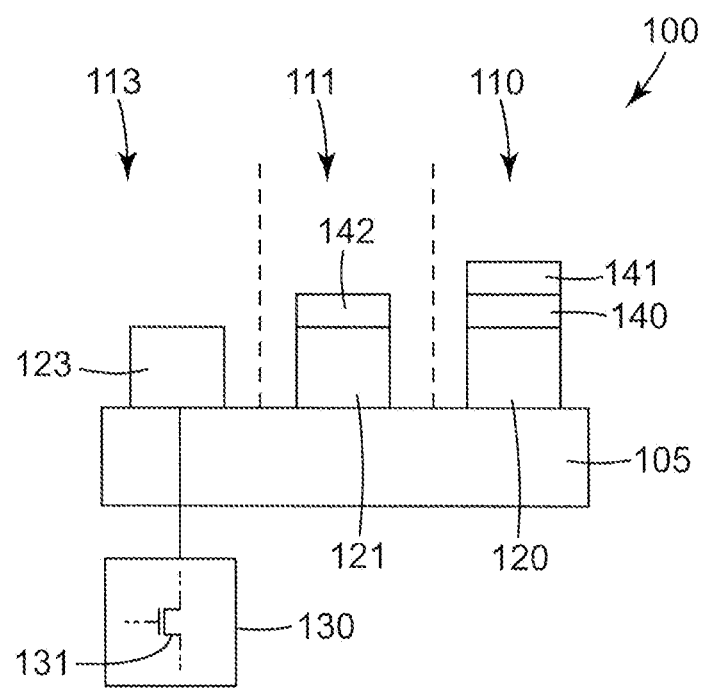
FIG. 1 schematically illustrates array of light emitting devices.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to light sources that incorporate a wavelength converter to convert the wavelength of at least a portion of the light originally emitted by the light source into at least one additional wavelength and, in some embodiments, two additional wavelengths or more. Herein, when light is said to be at a particular wavelength, it is to be understood that the light may have a range of wavelengths, with the particular wavelength being a peak wavelength within the range of wavelengths. For example, where it is stated that light has a wavelength of $\lambda$, it should be understood that the light may comprise a range of wavelengths having $\lambda$ as the peak wavelength of the range of wavelengths. Additionally, if it is stated that the light is of a particular color, then it is to be understood that the light is perceived as that color even though it may contain components of a different color. For example, if it is stated that light is blue, the light is perceived as blue but may have a broad spectrum and may even include components that lie outside the blue region of the spectrum.

The light sources described herein can have larger or smaller light emitting regions where the output light of each region can be actively and independently controlled. The light sources can be used in, for example, a projection system to illuminate one or more image forming devices. Each light emitting region of the light source can illuminate a different portion or zone of the image forming device. Such a capability allows for efficient adaptive illumination systems where the output light intensity of a light emitting region of the light source can be actively adjusted to provide the minimum illumination required by a corresponding zone in the image forming device.

The disclosed light sources can form monochromatic (for example green or green on black) or color images. Such disclosed light sources combine the primary functions of light sources and image forming devices resulting in reduced size, power consumption, cost and the number of elements or components used in an optical system that incorporates the disclosed light sources. For example, in a display system, the disclosed light sources can function as both the light source and the image forming device, thereby eliminating or reducing the need for a backlight or a spatial modulator. As another example, incorporating the disclosed light sources in a projection system eliminates or reduces the need for image forming devices and relay optics.

Arrays of luminescent elements, such as arrays of pixels in a display system, are disclosed in which the luminescent elements include an electroluminescent device, such as a light emitting diode (LED), capable of emitting light in response to an electric signal. Some of the luminescent elements include one or more light converting elements, such as one or more potential wells and/or quantum wells, for down-converting light that is emitted by the electroluminescent devices. Down-conversion is a process that produces output light, or converted light, having a longer wavelength than the input, unconverted, light.

Arrays of luminescent elements disclosed in this application can be used in illumination systems, such as adaptive illumination systems for use in, for example, projection systems or other optical display systems.

FIG. 1 is a schematic side-view of a light emitting system 100 that includes an array of luminescent elements, such as luminescent elements 110, 111 and 113, where each element is capable of independently outputting light. Each luminescent element includes an electroluminescent device that is capable of emitting light in response to an electric signal. For example, luminescent elements 110, 111 and 113 include respective electroluminescent devices 120, 121 and 123 that may be disposed on a substrate 105.

In some cases, the luminescent elements are configured in an active matrix, meaning that at least some of the luminescent elements include respective dedicated switching circuits for driving the electroluminescent device(s) in those elements. In such cases, a luminescent element 113 may include a dedicated switching circuit 130 for driving electroluminescent device 123. The switching circuit 130 may include one or more transistors 131.

In some cases the luminescent elements may be configured as a passive matrix, meaning that the luminescent elements are not configured as an active matrix. In a passive matrix configuration, no luminescent element has a dedicated switching circuit for driving the electroluminescent device(s) in that element.

Typically, in a passive matrix configuration, the electroluminescent devices in the light emitting system are energized one row at a time. In contrast, in an active matrix configuration, although the rows are typically addressed one at a time, the switching circuits typically allow the electroluminescent devices to be energized individually. In some cases, at least some, and perhaps all, of the electroluminescent devices in light emitting system are monolithically integrated. As used herein, monolithic integration includes, but is not necessary limited to, two or more electronic devices that are manufactured on the same substrate (a common substrate) and used in an end application on the same common substrate. Monolithically integrated devices that are transferred to another substrate as a unit remain monolithically integrated. Exemplary electronic devices include LEDs, transistors, capacitors and the like.

Where portions of each of two or more elements are monolithically integrated, the two elements are considered to be monolithically integrated. For example, two luminescent elements are monolithically integrated if, for example, the electroluminescent devices in the two elements are monolithically integrated. This is so, even if, for example, the light converting element in each element is adhesively bonded to the corresponding electroluminescent device.

In cases where the electroluminescent devices include semiconductor layers, the electroluminescent devices are monolithically integrated if the devices are manufactured on the same substrate and/or if they include a common semiconductor layer. For example, where each electroluminescent device includes an n-type semiconductor layer, the devices are monolithically integrated if the n-type semiconductor layer extends across the electroluminescent devices. In such a case, the n-type semiconductor layers in the electroluminescent devices may form a continuous layer across the electroluminescent devices.

At least one luminescent element in light emitting system 100 includes one or more light converting elements for converting light emitted by the electroluminescent device(s) in the luminescent element. For example, luminescent element 110 includes light converting elements 140 and 141, and luminescent element 111 includes light converting element 142. In some cases a light converting element can be, or may include, a potential well or a quantum well.

As used herein, potential well means one or more semiconductor layers in a multilayer semiconductor structure designed to confine a carrier in one dimension only, where the semiconductor layer or layers have lower conduction band energy than surrounding layers and/or higher valence band energy than surrounding layers. The term "quantum well" generally refers to a potential well that is sufficiently thin that quantization effects increase the energy for electron-hole pair recombination in the well. A quantum well typically has a thickness of about 100 nm or less, and preferably about 10 nm or less. The term "quantum dot" refers to a potential well that confines a carrier in three dimensions, and is sufficiently small that quantization effects increase for electron-hole pair recombination within the dot. A quantum dot typically has a dimension of less than 100 nm and preferably about 10 nm or less.

In some embodiments, not all luminescent elements in the light emitting system 100 include a light converting element. For example, luminescent element 113 includes electroluminescent device 123 but does not include a light converting element. In such cases, the light output of the luminescent element and the electroluminescent device in the luminescent element have the same wavelength or spectrum.

In the context of a display system, a luminescent element can be a pixel or a sub-pixel in the light emitting system. The pixelated light emitting system can emit light at different wavelengths, for example, in the visible region of the spectrum. For example, the electroluminescent devices 120, 121, 123 in the light emitting system 100 may emit blue light. Light converting element 140 may include a blue-to-green light converting potential well absorbing the blue light emitted by the electroluminescent device 120 and emitting green light. Light converting element 141 can include a green-to-red light converting potential well absorbing the green light emitted by the light converting element 140 and emitting red light. Light converting element 142 may include a blue-to-green light converting potential well to absorb the blue light emitted by electroluminescent device 121 and thus emit green light. In such cases, elements 110, 111 and 113 output red, green and blue light respectively. In another embodiment, light converting elements 141 and 142 include a blue-to-green potential well while light converting element includes a blue-to-red light converting well. In this latter case, red light generated in light converting element 140 is simply transmitted through light converting element 141.

Light emitting system 100 may efficiently output light at any desirable wavelength in, for example, the visible region of the spectrum. For example, light emitting system 100 can efficiently emit green light since the blue emitting electroluminescent devices and blue-to-green light converting elements can be highly efficient. Improved efficiency can result in reduced power consumption in an optical system that incorporates a light emitting system similar to system 100.

Light emitting system 100 can be more compact than conventional light sources. Accordingly, optical systems utilizing light emitting system 100 can be more compact, for example thinner, and have reduced weight.

In some applications, such as in a projection system or a backlight system, light emitting system 100 may function as a light source for illuminating one or more image forming devices. The light emitting system can be designed to efficiently emit, for example, a primary color or white light. The improved efficiency and the compactness of light emitting system 100 allows for improved and/or novel system designs. For example, portable battery-powered optical systems can be designed with reduced size, power consumption and weight.

In some applications, such as in projection systems, light emitting system 100 can function as both a light source and an image forming device. In such applications, conventional image forming devices such as liquid crystal display panels (LCDs) or digital micro-mirror devices (DMDs) can be eliminated from the projection system. Conventional projection systems include one or more relay optical elements for transferring light from light sources to image forming devices. The relay optics can be eliminated in a projection system that incorporates light emitting image forming device 100, thereby reducing the number of elements, size, optical loss, power consumption weight and overall cost.

In general, the array of luminescent devices in light emitting system 100 can be any type array desirable in an application. In some cases, the array can be a row or column, such as a 1×n array where n is an integer greater than or equal to two. In some cases, the array may be a two-dimensional array, for example a square (m×m) array or a rectangular array (m×n) array, where m and n are both integers greater than two. In some cases the array may be a trapezoidal array, a hexagonal array or any other type of array where the relative positions of the elements are regular or irregular.

In some cases the luminescent elements in the array (or pixels in the array in the context of a display system) can be of equal size, or of different sizes, for example to account for difference in the efficiency of generating different colors.

A luminescent element in an array of luminescent elements can have any shape, such as square, oval, rectangular or more complex shapes to accommodate, for example, optical and electrical functions of a device incorporating the array. The luminescent elements in an array can be placed in any arrangement that may be desirable in an application. For example, the elements can be uniformly spaced, perhaps in a rectangular or hexagonal arrangement. In some cases the elements may be placed non-uniformly, for example to improve device performance by reducing or correcting optical aberrations such as pincushion or barrel distortions.

An efficient, cost effective solid-state microemissive imager, having an image area on the order of one square centimeter in size, such as may be used for microprojection applications, has pixels that are small (around 2 μm for a VGA resolution imager) and low aspect ratio to reduce optical cross-talk between adjacent pixels. No single solid-state material has been identified that can be used for direct efficient electroluminescent emission over the full visible spectrum (at least about 440 nm to about 640 nm for projection applications). The generally proposed approach is to absorb a portion of the light emitting by a short wavelength light emitting diode (LED) and to re-emit the energy at a longer wavelength in a spatially selective manner. Suitable down-conversion materials include semiconductor quantum wells, quantum dots and rate-earth phosphors. One challenge with quantum dots and phosphors is that the material extinction coefficient of these materials is relatively low, and thus a relatively thick conversion layer is required to absorb the short wavelength light. Increasing the concentration of the absorbing species (e.g. quantum dots or rare earth dopant ions) can reduce the thickness of the absorbing layer, but this is counter-balanced by self-quenching effects which can reduce the down-conversion efficiency.

In accordance with the purposes of the present invention, as embodied and broadly described herein, the present invention provides a light emitting device that includes a primary light source having a defined emission photon energy output. Nanoparticles are situated in close proximity to said primary light source, the nanoparticles having an absorption onset equal to or less in photon energy than the emission photon energy output of the primary light source. Non-radiative energy transfer from the primary light source to the nanoparticles can occur, yielding light emission from the nanoparticles rather than the primary light source. In some embodiments, the light emitting device is a light emitting diode (LED) and the primary light source is the active layer of the LED.

Non-radiative pumping of fluorophores has been demonstrated as an alternative approach for down-conversion. In this case, dipole-dipole coupling between an emitting layer and a nearby fluorophore can lead to efficient Förster resonance energy transfer (FRET) from one to the other without the optical inefficiencies associated with radiation and re-absorption. The rate of this non-radiative energy transfer scales as $d^{-4}$, where d is the separation distance between the emitting layer and the fluorophore dipoles involved in the energy transfer. Accordingly, the fluorophore and the active layer have to be very close, typically around 10 nm or less, for FRET to occur with reasonable efficiency.

Non-radiative pumping of a monolayer of CdS nanocrystals on top of an InGaN/GaN quantum well has been previously demonstrated but the challenge with this approach is that the LED layer (either p-layer or n-layer) that lies between the LED quantum well layer and the nanocrystals has to be less than about 10 nm thick in order to achieve the efficient transfer of energy. In the InGaN/GaN system previously demonstrated, the LED layer between the active layer and the nanocrystals was an n-doped layer because the mobility of carriers in the n-doped layer is higher than the mobility of the carriers in the p-doped layers. Such a thin LED layer, however, leads to poor current spreading and an inefficient pump source.

According to at least some of the embodiments of the present invention, the problem of the thin layer is reduced by providing a grid electrode across the light emitting device.

Figure 2:
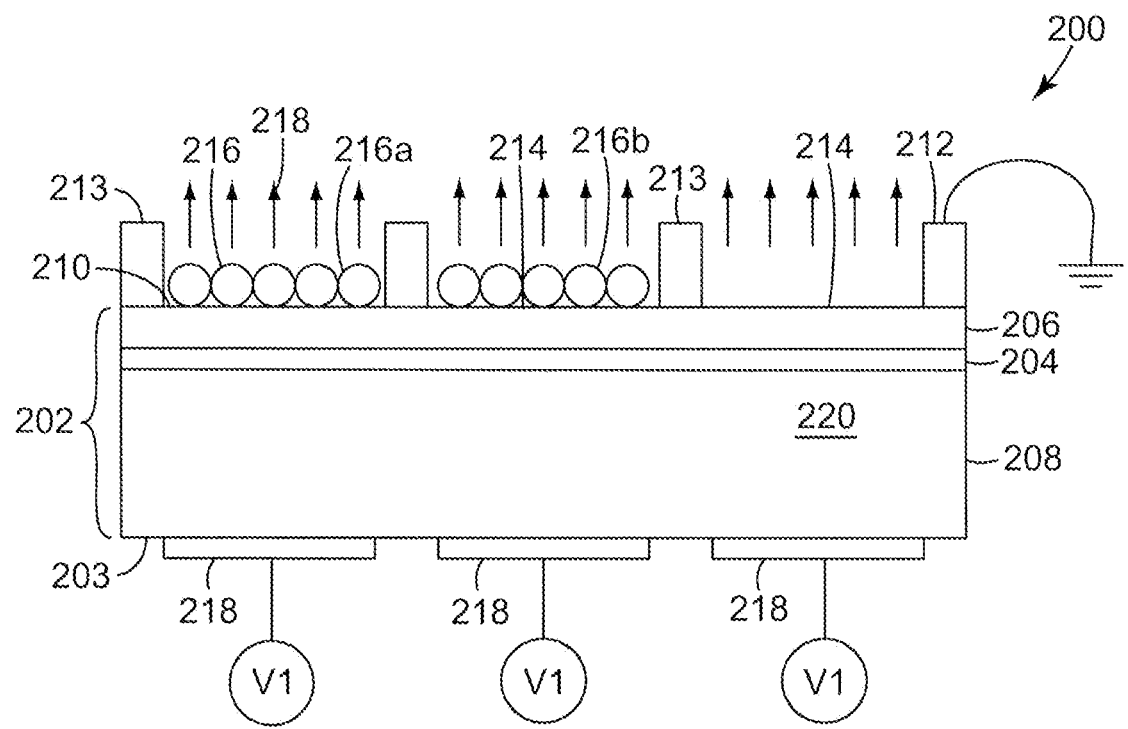
FIG. 2 schematically illustrates an embodiment of a light emitting system that uses non-radiative energy transfer from an active region to energize light emitting elements according to principles of the present invention.

An exemplary embodiment of a light emitting system 200 that uses non-radiative down-conversion is schematically illustrated in FIG. 2. The system 200 includes an electroluminescent device 202. In some cases, the electroluminescent device 202 can include a phosphorescent material capable of emitting light when absorbing electrical energy. In some cases, electroluminescent device 202 can include a semiconductor electroluminescent device such as a light emitting diode (LED) or a laser diode. An electroluminescent device in light emitting system 200 can be any device capable of emitting light in response to an electrical signal.

For example, an electroluminescent device can be a light emitting diode (LED) capable of emitting photons in response to an electrical current as discussed in, for example, U.S. Patent Publication No. 2006/0124917, entitled "Adapting Short-Wavelength LED's for Polychromatic, Broadband, or 'White' Emission", incorporated herein by reference in its entirety. In some cases an LED can include one or more p-type and/or n-type semiconductor layers, one or more active layers that may include one or more potential and/or quantum wells, buffer layers, substrate layers, and superstrate layers.

In other embodiments, the electroluminescent device 202 may include a laser, for example a semiconductor laser such as a vertical cavity surface emitting laser (VCSEL), or the like.

In the illustrated embodiment, the electroluminescent device 202 is shown as an LED 203, which is schematically illustrated as having an active layer 204 disposed between a first doped layer 206 and a second doped layer 208. The active layer 204 is capable of producing pump light having a wavelength of $\lambda_p$. The first and second doped layers 206 and 208 are of opposite doping type, and so the first doped layer 206 may be n-doped while the second doped layer 208 is p-doped, or the first doped layer 206 may be p-doped while the second doped layer 208 is n-doped. In many different semiconductor systems the electron mobility is higher than the hole mobility, and so n-doped material has lower resistivity than p-doped material. Since the first semiconductor layer 206 has to be very thin in order to permit dipole-dipole coupling between the active layer 204 and nanoparticles positioned on the surface 210 of the first semiconductor layer 206, it is preferred to use the lower resistivity n-doped semiconductor for the first semiconductor layer 206.

A grid electrode 212 is connected to the first doped layer 206. The grid electrode 212 is formed of lines 213 of a conducting material positioned on the surface 210, leaving areas 214 of the surface 210 that are not covered by the conducting material. Light emitting elements 216, typically formed of nanoparticles as is discussed below, may be positioned in the areas 214 of the surface 210.

One or more active electrodes 218 are connected to the second doped layer 208. In some embodiments there are two or more active electrodes 218, which may be activated together or may be activated independently of each other. The area of the active layer 204 above a particular active electrode 218 is energized when that active electrode 218 is activated. Thus, when the different active electrodes 218 are activated independently of each other, the different areas of the active layer 204 above the respective active electrodes become energized. For example, when a signal is applied to the active electrode 218 marked "V1", without signals being applied to the active electrodes 218 marked "V2" or "V3", then only that area of the active layer 204 that lies above electrode V1 is energized. Thus various areas of the electroluminescent device 202 can selectively be energized in a desired pattern.

It will be appreciated, of course, that the electroluminescent device 202 may have any desired number of active electrodes 218, depending on the desired application of the device. When the electroluminescent device 202 is provided with three or more active electrodes 214, the active electrodes 214 may be formed in a regular pattern, or an irregular pattern, across the area of the device 202. In those embodiments in which only a single active electrode is used, the active electrode may be coupled to either the first or second doped layer 206 or 208. In some embodiments, for example as in the illustrated embodiment, there is an active electrode provided 218 under respective areas 214 between the lines 213 of the grid electrode 212.

The active layer 204 is the layer in which the electroluminescent device 202 normally generates light. In both LEDs and lasers, the active layer is typically a diode junction, where carrier recombination produces light. Thus, the active layer 204 may be any type of layer known for generating light, for example a heterojunction layer, a quantum well layer, and the like.

The presence of electron/hole pairs in the active layer 204 close to the surface 210 of the first semiconductor layer 206 just below the light emitting elements 216, permits dipole-dipole coupling to take place between the electron/hole pairs in the active layer 204 and the light emitting elements 216. This coupling may lead to efficient Förster energy transfer, which results in non-radiative transfer of energy from the active layer 204 to the light emitting elements 216, which become excited. The excited light emitting elements 216 consequently emit light 218, for example at a wavelength, $\lambda 1$, which is typically longer than $\lambda p$. The strength of non-radiative coupling between the electron/hole pairs in the active layer 204 and the light emitting elements 216 varies as $d^{-4}$, where d is the distance separating the light emitting element 216 from the electron/hole pair. One consequence of this strong inverse dependence on separation distance is that the amount of energy coupled non-radiatively to the light emitting elements 216 can be significantly increased if the electron-hole pairs in the active layer 204 can be concentrated close to the light emitting elements 216.

In some embodiments, the active layer 204 constitutes a quantum well, which traps carriers, resulting in an increase in the concentration of electrons and holes close to the surface 210, thus increasing the non-radiative coupling efficiency of energy to the light emitting elements 216.

The lines 213 of the grid electrode 212 may be formed of any suitable electrically conductive material. For example, the lines 213 may be formed of a metal deposited on the surface 210, such as gold, platinum, copper, aluminum, silver or the like, or alloys containing these or other metals. Other suitable materials that may be deposited on the surface 210 to form the grid lines 213 include a conducting semiconductor material, such as a doped semiconductor. Suitable semiconductor materials are preferably lattice matched to the semiconductor of the first doped layer 206, and include Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys or other combinations of any of the compounds listed above. Other materials that may optionally be used for fabricating the lines 213 of the grid electrode 212 include transparent conducting oxides, such as doped $SnO_2$, $In_2O_3$, $Cd_2SnO_4$, ZnO, and $Zn_2SnO_4$, and indium tin oxide, which may be deposited by such techniques as chemical vapor deposition or sputtering. In some embodiments, the lines 213 of the grid electrode 212 may be taller than the light emitting elements 216.

Figure 3:
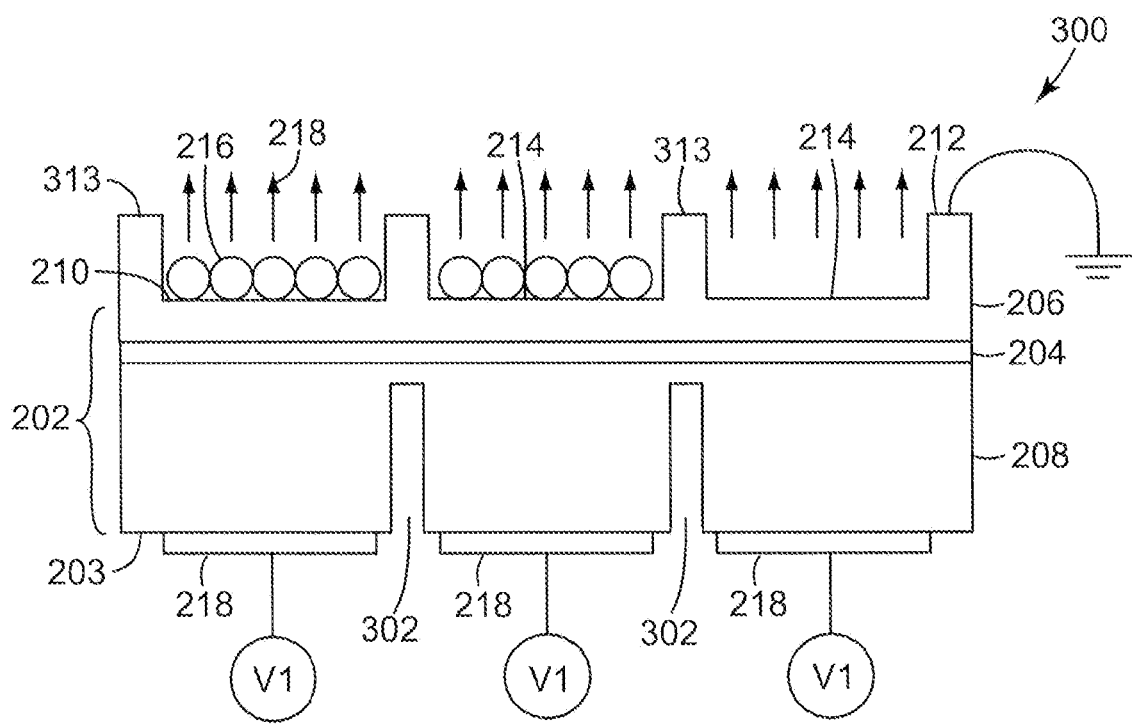
FIG. 3 schematically illustrates another embodiment of a light emitting system that uses non-radiative energy transfer from an active region to energize light emitting elements according to principles of the present invention.

In some embodiments, for example the device 300 shown in FIG. 3, the grid lines 313 may be formed of the same material as the first doped layer 206. In such embodiments, the grid lines 313 may be formed by depositing material on the first doped layer 206, or growing a thick first doped layer 206 and etching back areas of the first doped layer to produce the regions 214.

The different emitting regions in the electroluminescent device 202 may be electrically pixelated, as shown in FIG. 2, or may be physically pixelated, with a region of air or other dielectric material between pixels. In the embodiment illustrated in FIG. 3, pixel boundaries 302 are disposed between pixels. The pixel boundaries 302 are shown as etched areas that contain air. The pixel boundaries 302 could, however, contain another dielectric material. It will be appreciated that the light emitting system 300 may only have one electrode below the second doped region 208, common to all pixels, with the only effective pixelation arising from the pixel boundaries. In other embodiments, two or more different pixels may share electrodes.

Various different embodiments of light emitting elements 216 are contemplated. One type of light emitting element 216 is a semiconductor particle having two or more orthogonal dimensions less than 100 nm and preferably less than 10 nm. In some embodiments the particle has three orthogonal dimensions less than 100 nm, in which case the particle is termed a "quantum dot." In other embodiments, where only two orthogonal dimensions are less then 100 nm, the particle is termed a "quantum wire." A particle having at least two orthogonal dimensions less than 1000 nm is regarded as being a nanoparticle. The confinement from a quantum wire or quantum dot, in two or three dimensions respectively, results in the production of a distinct set of energy levels. The wavelength at which the quantum wire or dot radiates is dependent in part on the type of semiconductor from which the quantum wire or dot is made, and in part on its size. Quantum wires or dots can be formed of any suitable type of semiconductor material, which is a design choice based on the wavelength range of the radiation that the quantum dot is designed to emit. While not intended to be limiting, some suitable types of semiconductor materials include Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys or other combinations of any of the compounds listed above.

Other types of light emitting elements 216 may be formed from nanoparticles of phosphor materials such as strontium thiogallates, doped GaN, copper-activated zinc sulfide, silver activated zinc sulfide. Other useful nanophosphor materials may include doped YAG, silicate, silicon oxynitride, silicon nitride, and aluminate based phosphors. Examples of such phosphors include Ce:YAG, SrSiON:Eu, SrSiN:Eu and BaSrSiN:Eu. Additionally, light emitting elements 216 may be formed from nanoparticles of light emitting polymers, for example from thin films of light emitting molecules or light emitting polymers such as, poly(p-phenylene vinylene), polyfluorene, polythiophenes, polypyridines, poly(pyridyl vinylenes), and copolymers of these materials. Useful small molecule emitters include laser dyes, tris(8-hydroxyquinolinato)aluminum (Alq3) and the like.

Figure 4:
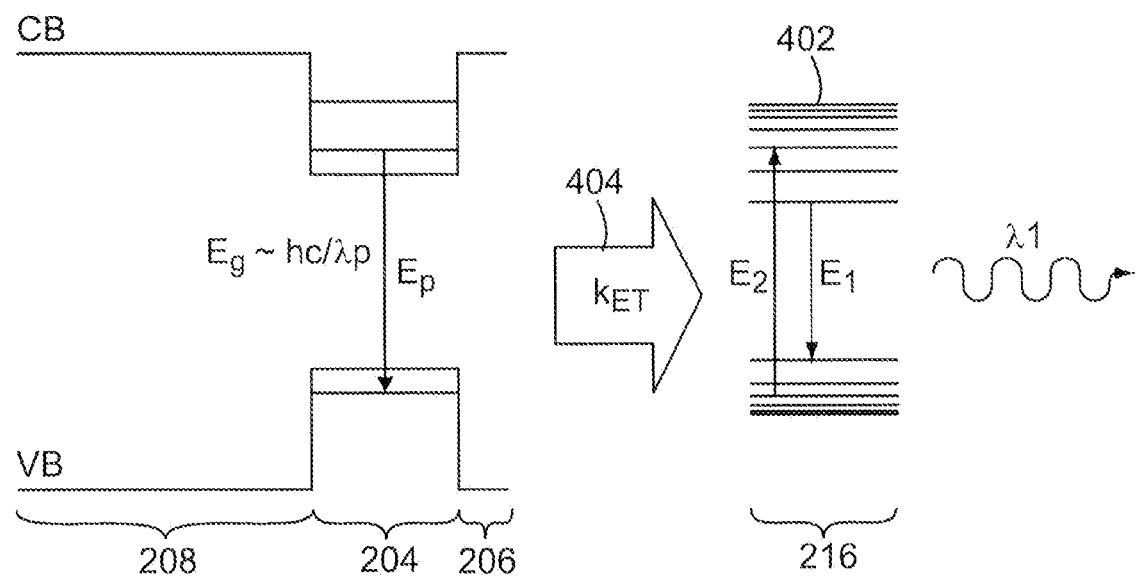
FIG. 4 schematically presents energy levels within different portions of the systems illustrated in FIGS. 2 and 3, to illustrate the transfer of energy within the light emitting systems.

An exemplary schematic energy level diagram, presented in FIG. 4, is useful in understanding the various processes involved in converting energy from the electroluminescent device 202 into light at another wavelength. At the left of the diagram is shown the energy gap between the valence band (VB) and the conduction band (CB) in the first and second layers 206, 208 of the electroluminescent device 202, and in the active layer 204. In the illustrated embodiment the active layer 204 is a quantum well, which concentrates carriers close to the surface 210 and also contains discrete energy levels. The energy gap in the active layer 204, Eg, is the difference in energy between the conduction and valence bands. The energy of the photons emitted by the quantum well, $E_p$, is equal to the transition energy of the well, which is determined by both the energy gap of the material forming the quantum well and the dimensions of the quantum well, due to quantum confinement effects. The wavelength, $\lambda p$, of the light emitted by the active layer is determined by $E_p \sim hc/\lambda p$, where h is Planck's constant and c is the speed of light.

The light emitting element 216, shown at the right side of the figure, demonstrates an energy level structure 402 which, in the case of the light emitting element being a quantum dot, arises from the small dimensions of the quantum dot. For clarity, only a small number of the possible energy levels are illustrated. The light emitting element 216 has at least two energy levels separated by an energy difference, $E_1$, that corresponds to the converted wavelength, $\lambda 1$, i.e. $E_1 \sim hc/\lambda 1$.

The electrons and holes collected in the quantum well 204 are subject to the competing processes of i) radiative recombination, which results in the emission of a photon at $\lambda p$, and ii) non-radiative dipole-to-dipole energy transfer, which results in excitation of a photon from the light emitting element at $\lambda 1$. The latter effect becomes increasingly more likely when the dipole-to-dipole coupling is stronger, e.g. when the first semiconductor layer 206 is thinner. The non-radiative dipole-to-dipole energy transfer is represented in the figure by the arrow 404, characterized by the non-radiative energy transfer coefficient $k_{ET}$.

In some embodiments, the transition energy of the quantum well 204, $E_g$, may be engineered to be to be substantially similar to the energy difference $E_1$, for example within about 25% of $E_1$. The coupling coefficient for non-radiative energy transfer, $k_{et}$, increases as $E_p$ approaches the same value as $E_1$. In other embodiments, the transition energy of the quantum well 204, $E_p$, may be engineered to be to be substantially similar to the energy difference, $E_2$, between two energy levels in the light emitting element 216, at least one of which is not involved in the emission of the light at $\lambda 1$. In such a case, the light emitting element 216 emits light at $\lambda 1$ with some internal relaxation to account for the difference in energies $E_1$ and $E_2$.

Several different methods are available for applying the light emitting elements to the device. For example, colloidal light emitting elements may be patterned on the surface 210 of the first doped layer 206 using directed self-assembly, microcontact printing, nanoimprint lithography, conventional photolithography, Langmuir Blodgett monolayer deposition or other techniques. In one particular example of directed self-assembly, the surface 210 may be patterned with bi-functional self-assembled monolayers that bind the desired type of quantum dot in the selected region.

Such techniques may also be used to selectively position different types of light emitting element in selected areas. For example, light emitting elements capable of emitting light at a first wavelength may be positioned in certain areas while light emitting elements capable of emitting light at a different wavelength are positioned in different areas. Such selectivity in manufacturing allows the device to independently control the emission of light of different colors from different areas of the device, i.e. the device has independently controllable pixels that emit light of different colors. In the embodiment illustrated in FIG. 2, a first set of light emitting elements 216a is positioned above active electrode V1 while a second set of light emitting elements 216b is positioned above active electrode V2. If the first and second sets of light emitting elements 216a and 216b emit light at different wavelengths, $\lambda 1$ and $\lambda 2$ respectively, then the active electrodes V1 and V2 can be used to independently control the emission of light from the device 200 at wavelengths $\lambda 1$ and $\lambda 2$. In the illustrated embodiment, the third active electrode V3 is used to activate a portion 220 of the electroluminescent device 202 that does not have associated light emitting elements. Thus, the active layer 204 in region 220 emits light at the pump wavelength, $\lambda p$. It will be appreciated that the device 200 may stretch beyond the limits of the figure, and that additional regions, not shown, may produce light at $\lambda p$, $\lambda 1$ or $\lambda 2$. In some embodiments, $\lambda p$ is blue light while $\lambda 1$ and $\lambda 2$ are green and red respectively. Thus, the device 200 may be capable of producing the full color gamut needed for color imaging.

Figure 5:
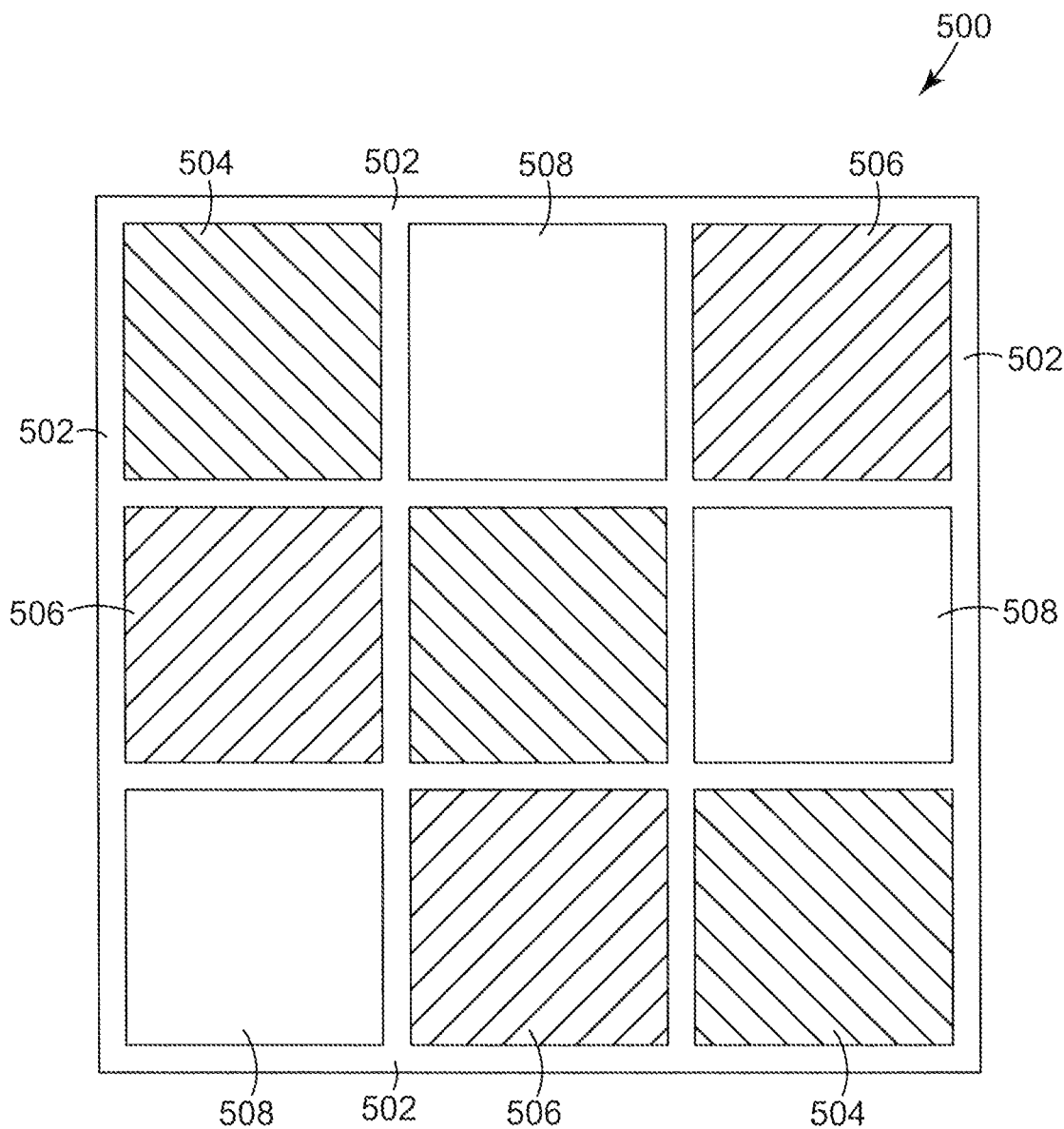
FIG. 5 schematically illustrates an embodiment of a multi-pixel light emitting system according to principles of the present invention.

An exemplary embodiment of a portion of the emitting side of a light source that uses a wire grid electrode is schematically illustrated in FIG. 5. The device 500 shows nine pixels, although it will be appreciated a device may have more or fewer pixels. Each pixel emits light of a particular color. In the illustrated embodiment, a wire grid electrode 502 delineates the pixel areas. Regions 504 hatched from upper left to lower right emit light at $\lambda 1$, while regions 506 hatched from upper right to lower left emit light at $\lambda 2$. The blank regions 508 emit light at the pump wavelength, $\lambda p$. The different regions 504, 506, 508 can be independently driven using an arrangement of separate active electrodes.

In other embodiments, all of the regions may be driven simultaneously, in which case the device 500 produces a light containing a mixture of different wavelengths. If the mixture of different wavelengths is correctly balanced for human vision, the device may be perceived as producing white light.

Figure 6:
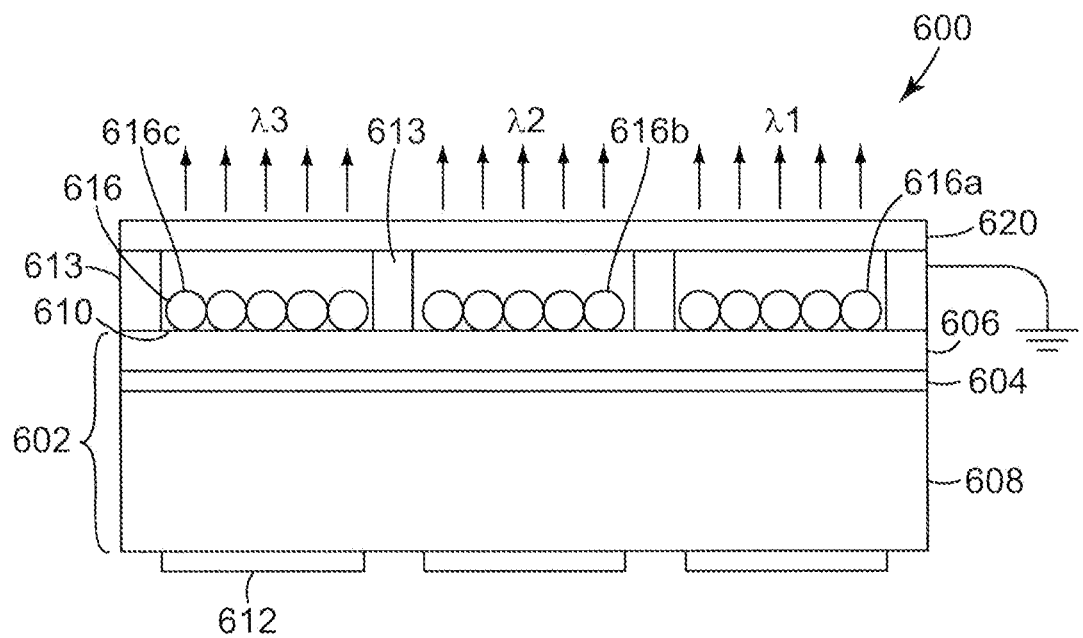
FIGS. 6 and 7 schematically illustrates other embodiments of light emitting systems that use non-radiative energy transfer from an active region to energize light emitting elements according to principles of the present invention.

Another embodiment of a light emitting system 600 is schematically illustrated in FIG. 6. The system 602 includes an electroluminescent device 602 having an active layer 604 positioned between a first doped semiconductor layer 606 and a second doped semiconductor layer 608. A grid electrode 613 is positioned on the upper surface 610 of the first semiconductor doped layer 606. The electroluminescent device 602 may be of any of the types of electroluminescent device discussed above. One side of the electroluminescent device 602 is provided with one or more electrodes 612 that are connected to the second doped layer 608 and may be, but are not required to be, independently addressable.

In this embodiment the gaps between the lines of the grid electrode 613 are all filled with nanoparticles 616. The nanoparticles 616 may include nanoparticles that can emit light at different colors and may be arranged in any desired manner. In the illustrated embodiment, nanoparticles 616a that can emit light at $\lambda 1$ are positioned together to form a first pixel, while nanoparticles 616b that can emit light at λ2 are positioned together to form a second pixel while nanoparticles that can emit light at λ3 are also positioned together to form a third pixel. It will be appreciated that the system 600 may include multiple pixels that emit light at respective wavelengths λ1, λ2, and λ3, or at additional wavelengths.

In some embodiments, an optional filter 620 may be positioned over the electroluminescent device 602, to reduce the transmission of light at any unwanted wavelengths. For example, since the process of nonradiative transfer of energy from the active layer 604 to the light emitting elements 616 competes with the process of radiative recombination, there may be some residual light emitted from the active layer 604 at the wavelength set by the transition energy of the active layer 604, λp. In such a case, it may be desired to use a filter 620 to reduce the amount of light at λp that is emitted by the system 600. The filter 620 may operate in any suitable manner to achieve the desired reduction of the filtered wavelengths. For example, the filter 620 may differentially absorb light at different wavelengths, or may differentially reflect light at different wavelengths.

Figure 7:
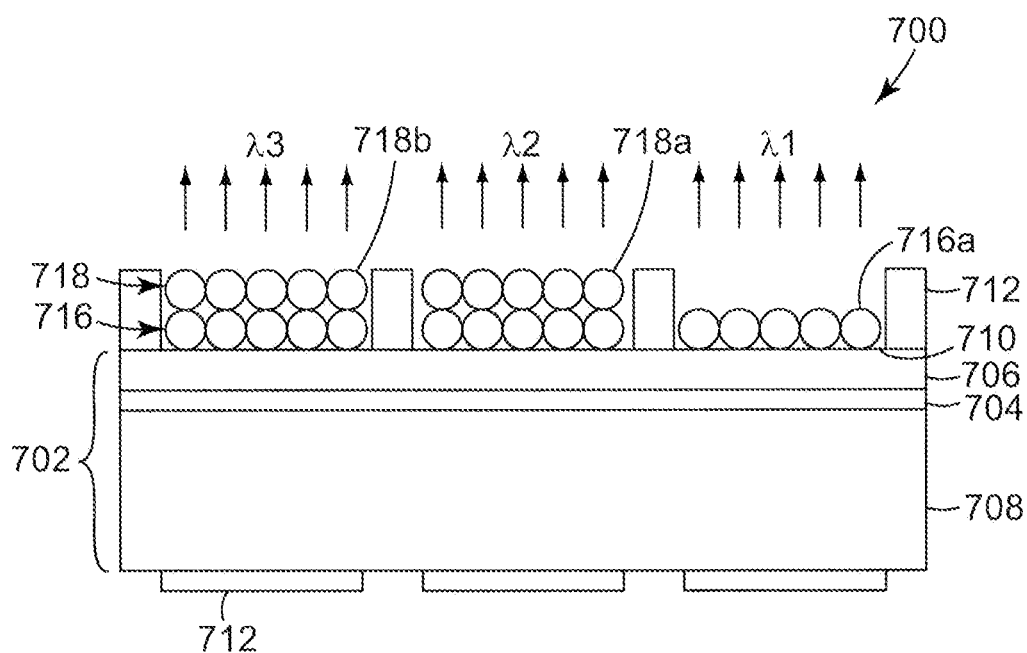

Another embodiment of a light emitting device 700 is schematically illustrated in FIG. 7. The device 700 includes an electroluminescent device 702 topped with a grid electrode 712 on the surface 710. The electroluminescent device 702 includes an active layer 704 positioned between a first doped semiconductor layer 706 and a second doped semiconductor layer 708. The electroluminescent device 702 may be of any of the types of electroluminescent device discussed above. One side of the electroluminescent device 702 is provided with one or more electrodes 712 that are connected to the second doped layer 708 which may be, but are not required to be, independently addressable.

A first layer of nanoparticles 716, i.e. particles having at least two dimensions less than 100 nm, is positioned on the surface 710, close to the active layer 704, for non-radiative energy transfer from the quantum well 704, in the manner described above.

A second layer of nanoparticles 718 is positioned above the first layer of nanoparticles 716, sufficiently close that the first nanoparticles 716 can non-radiatively transfer energy to the second nanoparticles 718. The first nanoparticles 716 are non-radiatively excited through a dipole-dipole interaction with the active layer 704, as previously described. Some of the first layer of nanoparticles 716 may emit light at a first wavelength λ1. Some of the energy in the first layer of nanoparticles 716 may then be non-radiatively transferred to the second layer of nanoparticles 718. Accordingly, at least some of the second layer of nanoparticles 718 may emit light at a second converted wavelength, λ2, which is different from λ1. In some embodiments, the second layer of nanoparticles 718 may include only nanoparticles 718a that emit light at around λ2. In other embodiments, the second layer of nanoparticles 718 may include some nanoparticles 718a that emit light at λ2, and also include nanoparticles 718b that emit light at some other wavelength, λ3.

The relative positions of the nanoparticles that emit light may be selected. For example, in the illustrated embodiment, the nanoparticles 716a that emit light at λ1 are separated from the nanoparticles 718a that emit light at λ2 by the grid electrode 712. Similarly, the nanoparticles 718a are separated by the grid electrode 712 from the nanoparticles 718b that emit light at λ3.

By selective positioning of the different types of nanoparticles 718a, 718b in the second layer of nanoparticles 718, or by omitting nanoparticles from certain regions altogether, the second layer of nanoparticles 718 may form a pixelated array of light emitting regions suitable for use as the imager in a projection system. In other embodiments, the nanoparticles 716a, 718a, 718b may be used simply to produce light at different wavelengths, for example to produce light perceived as white light, from a single source.

Figure 8:
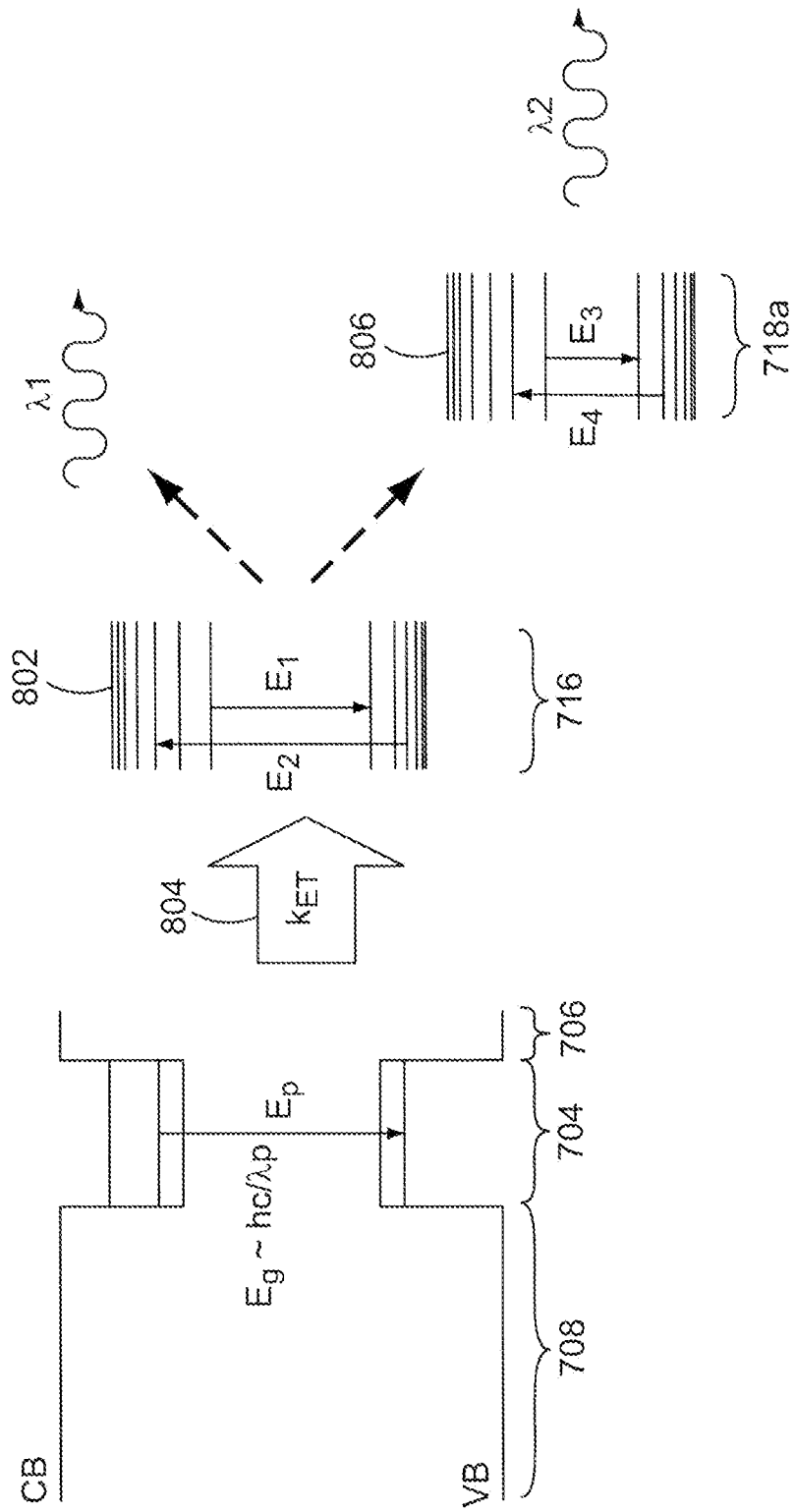
FIG. 8 schematically presents energy levels within different portions of the system illustrated in FIG. 7, to illustrate the transfer of energy within the light emitting systems.

An exemplary schematic energy level diagram, presented in FIG. 8, is useful in understanding the various processes involved in converting energy from the electroluminescent device 700 into light at different wavelengths. At the left of the diagram is shown the energy gap between the valence band (VB) and the conduction band (CB) in the first and second layers 706, 708 of the electroluminescent device 702, and in the active layer 704. In the illustrated embodiment the active layer 704 is a quantum well, which concentrates carriers close to the surface 710 and also contains discrete energy levels. The energy gap in the active layer 704, Eg, is the difference in energy between the conduction and valence bands. The energy of the photons emitted by the quantum well, $E_p$, is equal to the transition energy of the quantum well, which is determined by both the energy gap of the material forming the quantum well and the dimensions of the quantum well, due to quantum confinement effects. The wavelength, λp, of the light emitted by the active layer is determined by $E_p$~hc/λp, where h is Planck's constant and c is the speed of light.

The first light emitting element 716 demonstrates an energy level structure 802 which, in the case of the light emitting element being a quantum dot, arises from the small dimensions of the quantum dot. For clarity, only a small number of the possible energy levels are illustrated. The first light emitting element 716 has at least two energy levels separated by an energy difference, $E_1$, that corresponds to the converted wavelength, λ1, i.e. $E_1$~hc/λ1.

The electrons and holes collected in the quantum well active layer 704 are subject to the competing processes of i) radiative recombination, which results in the emission of a photon at λp, and ii) non-radiative dipole-to-dipole energy transfer, which results in excitation of a photon from the light emitting element 716 at λ1. The latter effect becomes increasingly more likely when the dipole-to-dipole coupling is stronger, e.g. when the first semiconductor layer 706 is thinner. The non-radiative dipole-to-dipole energy transfer is represented in the figure by the arrow 804, characterized by the non-radiative energy transfer coefficient $k_{ET}$.

In some embodiments, the transition energy of the quantum well 704, $E_g$, may be engineered to be to be substantially similar to the energy difference $E_1$, for example within about 25% of $E_1$. The coupling coefficient for non-radiative energy transfer, $k_{et}$, increases as $E_p$ approaches the same value as $E_1$. In other embodiments, the transition energy of the quantum well 704, $E_p$, may be engineered to be to be substantially similar to the energy difference, $E_2$, between two energy levels in the first light emitting element 716, at least one of which is not involved in the emission of the light at λ1.

There are competing processes also going on within the first light emitting element 716, namely i) radiative emission of a photon at wavelength λ1, and ii) non-radiative, dipole-to-dipole coupling between the first light emitting element 716 and the second light emitting element 718. The fact that the first light emitting element may follow either route is shown by the dashed arrows. The energy level structure of the second light emitting element is schematically represented by the energy levels 806. In the case of non-radiative coupling to the second light emitting element 718, the energy at $E_1$ in the first light emitting particle 716 may couple either directly to a transition energy, $E_3$, within the second light emitting particle 718, which corresponds to the energy of the photon emitted by the second light emitting particle 718 at λ2. In other embodiments, the energy within the first light emitting particle 716 may couple to an energy transition within the second light emitting particle 718 having an energy $E_4$, which transition includes at least one energy level that is not involved in the emission of light at λ2. In such a case, the light emitting element 718 emits light at λ2 with some internal relaxation to account for the difference in energies $E_3$ and $E_4$.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices. For example, while the above description has discussed GaN-based LEDs, the invention is also applicable to LEDs fabricated using other III-V semiconductor materials, and also to LEDs that use II-VI semiconductor materials.

We claim:

1. A light source, comprising:
   a light emitting diode (LED) structure, comprising an active layer disposed between a first doped semiconductor layer and a second doped semiconductor layer, the active layer having energy levels associated with light of a first wavelength;
   a grid electrode on the first doped semiconductor layer, the grid electrode defining open regions of a surface of the first doped layer; and
   a first plurality of light emitting elements positioned on the surface of the first doped semiconductor layer in the open regions, at least some of the light emitting elements being excited by non-radiative energy transfer from the active layer, the light emitting elements being capable of emitting light at a second wavelength different from the first wavelength; and
   a second plurality of light emitting elements disposed over at least some of the first plurality of light emitting elements, at least some of the second plurality of light emitting elements being excited by non-radiative energy transfer from at least some of the first plurality of light emitting elements.

2. A light source, comprising:
   a light emitting diode (LED) structure, comprising an active layer disposed between a first doped semiconductor layer and a second doped semiconductor layer, the active region having energy levels associated with light of a first wavelength;
   a first plurality of light emitting elements positioned on at least part of a surface of the first doped semiconductor layer, at least some of the light emitting elements being excited by non-radiative energy transfer from the active layer, the light emitting elements being capable of emitting light at a second wavelength different from the first wavelength; and
   a second plurality of light emitting elements disposed over at least some of the first plurality of light emitting elements, at least some of the second plurality of light emitting elements being excited by non-radiative energy transfer from at least some of the first plurality of light emitting elements, the second plurality of light emitting elements being capable of emitting light at a third wavelength different from the second wavelength.

3. A light source as recited in claim 2, wherein the active layer comprises a quantum well and at least some energy levels in the quantum well are substantially similar to energy levels within the first plurality of light emitting elements.

4. A light source as recited in claim 2, wherein the first plurality of light emitting elements comprises semiconductor quantum dot structures.

5. A light source as recited in claim 2, wherein the first plurality of light emitting elements comprises semiconductor quantum wire structures.

6. A light source as recited in claim 2, wherein the first plurality of light emitting elements comprises nano-phosphor structures.

7. A light source as recited in claim 2, wherein the first plurality of light emitting elements comprises light emitting polymers.

8. A light source as recited in claim 2, wherein at least some of the second plurality of light emitting elements are capable of emitting light at the third wavelength and others of the second plurality of light emitting elements are capable of emitting light at a fourth wavelength different from the second and third wavelengths.

9. A light source as recited in claim 2, further comprising an arrangement of independently addressable electrodes on a second side of the LED structure, the second doped semiconductor layer being positioned between the electrodes and the active layer.

10. A light source as recited in claim 9, further comprising a grid electrode defining open area of the surface of the first doped semiconductor layer, the first plurality of light emitting elements being positioned in the open areas, at least some of the independently addressable electrodes being aligned with respective open regions of the first doped layer.

11. A light source as recited in claim 2, further comprising a grid electrode defining open area of the surface of the first doped semiconductor layer, the first plurality of light emitting elements being positioned in the open areas.

12. A light source as recited in claim 11, wherein the first doped layer is formed of a first doped semiconductor material and the grid electrode is formed of the first doped semiconductor material.

13. A light source as recited in claim 11, wherein the grid electrode comprises a metal grid electrode.

14. A light source as recited in claim 11, wherein the grid electrode comprises a conducting metal oxide.

15. A light source as recited in claim 11, wherein the grid electrode comprises a semiconductor material.

* * * * *